US010903155B2

(12) United States Patent
Cheah et al.

(10) Patent No.: US 10,903,155 B2
(45) Date of Patent: Jan. 26, 2021

(54) VERTICAL MODULAR STIFFENERS FOR STACKED MULTI-DEVICE PACKAGES

(71) Applicant: Intel Corporation, Santa Clara, CA (US)

(72) Inventors: Bok Eng Cheah, Bukit Gambir (MY); Jackson Chung Peng Kong, Tanjun Tokong (MY); Jenny Shio Yin Ong, Bayan Lepas (MY); Seok Ling Lim, Kulim (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/402,553

(22) Filed: May 3, 2019

(65) Prior Publication Data
US 2019/0393141 A1    Dec. 26, 2019

(30) Foreign Application Priority Data

Jun. 20, 2018  (MY) .......................... PI 2018000996

(51) Int. Cl.
*H01L 23/498* (2006.01)
*H01L 23/66* (2006.01)
*H01L 23/552* (2006.01)
*H01L 23/00* (2006.01)
*H01L 25/18* (2006.01)

(52) U.S. Cl.
CPC .. *H01L 23/49833* (2013.01); *H01L 23/49822* (2013.01); *H01L 23/49838* (2013.01); *H01L 23/552* (2013.01); *H01L 23/562* (2013.01); *H01L 23/66* (2013.01); *H01L 25/18* (2013.01); *H01L 2223/6616* (2013.01); *H01L 2223/6644* (2013.01); *H01L 2223/6688* (2013.01)

(58) Field of Classification Search
CPC ....... H01L 23/49833; H01L 2223/6616; H01L 2924/1421; H01L 2225/06541; H01L 25/0652; H01L 2225/06537
See application file for complete search history.

(56) References Cited

U.S. PATENT DOCUMENTS

2010/0327419 A1* 12/2010 Muthukumar ...... H01L 23/3121
257/686

* cited by examiner

*Primary Examiner* — Jay C Chang
*Assistant Examiner* — Mikka Liu
(74) *Attorney, Agent, or Firm* — Schwegman Lundberg & Woessner, P.A.

(57) ABSTRACT

Disclosed embodiments include a stacked multi-chip package that includes two semiconductor package substrates that are spaced apart by a vertical-device stiffener. The vertical-device stiffener provides both connection space for at least one vertical semiconductive device and at least one vertical radio-frequency device, as well as stiffness and form-factor reduction.

24 Claims, 6 Drawing Sheets

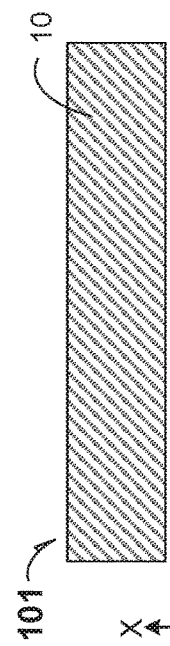
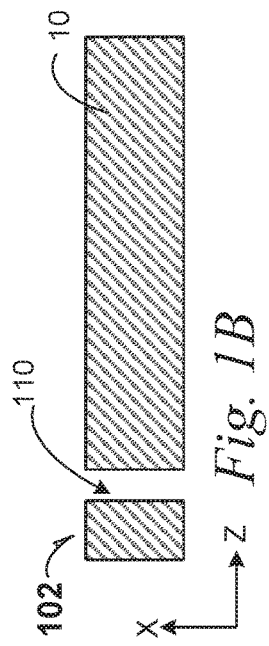
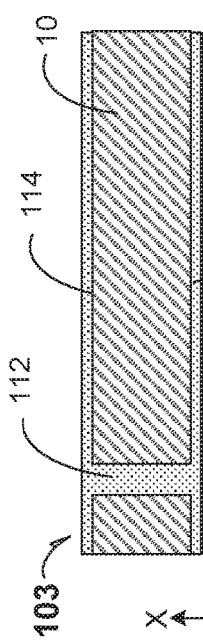
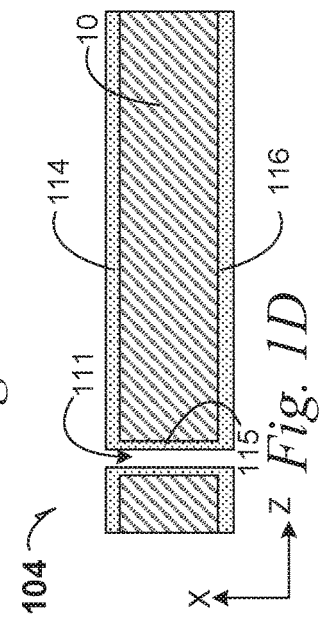
Fig. 1A  Fig. 1B  Fig. 1C  Fig. 1D
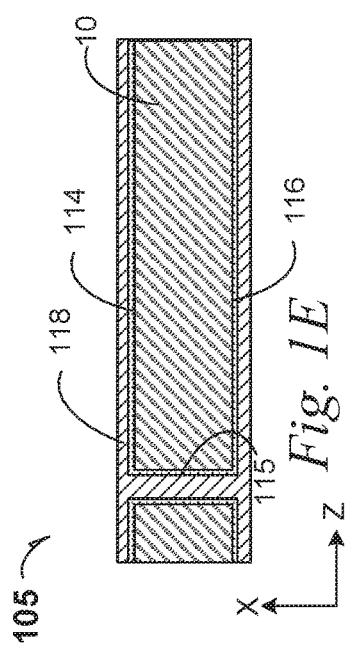
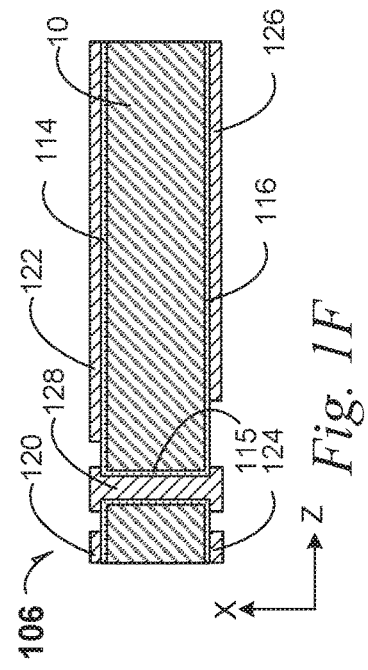
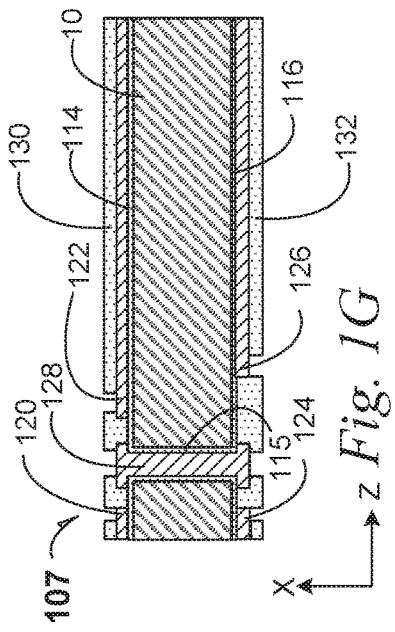
Fig. 1E  Fig. 1F  Fig. 1G

VERTICAL MODULAR STIFFENERS FOR STACKED MULTI-DEVICE PACKAGES

PRIORITY APPLICATION

This application claims the benefit of priority to Malaysian Application Serial Number PI 2018000996, filed Jun. 20, 2018, which is incorporated herein by reference in its entirety.

FIELD

This disclosure relates to multiple-device proximity and semiconductor package physical and electromagnetic interference integrity.

BACKGROUND

Semiconductive device miniaturization connected to device packaging, includes challenges to connect sufficient devices in smaller packages, while computational-power demands increased heat-management and electromagnetic noise-interference issues.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of a vertical-device stiffener during fabrication according to an embodiment;

FIG. 1B is a cross-section elevation of the vertical-device stiffener depicted in FIG. 1A after further processing according to an embodiment:

FIG. 1C is a cross-section elevation of the vertical-device stiffener depicted in FIG. 1B after further processing according to an embodiment:

FIG. 1D is a cross-section elevation of the vertical-device stiffener depicted in FIG. 1C after further processing according to an embodiment;

FIG. 1E is a cross-section elevation of the vertical-device stiffener depicted in FIG. 1D after further processing according to an embodiment;

FIG. 1F is a cross-section elevation of the vertical-device stiffener depicted in FIG. 1E after further processing according to an embodiment;

FIG. 1G is a cross-section elevation of the vertical-device stiffener depicted in FIG. 1F after further processing according to an embodiment;

DETAILED DESCRIPTION

Figure 2:
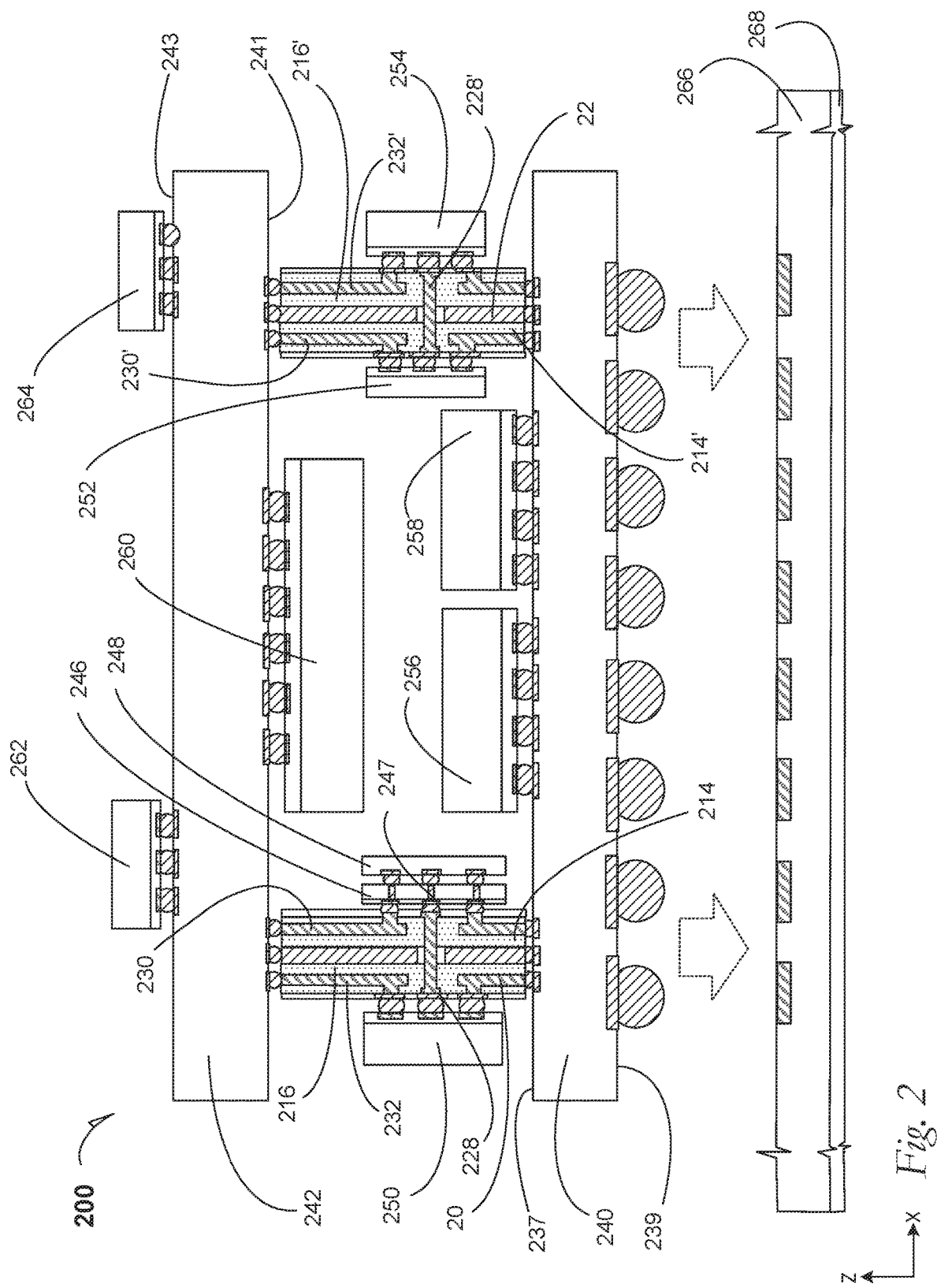
FIG. 2 is a cross-section elevation of a stacked multi-semiconductor device package according to several embodiments.

This disclosure describes heat-management and electromagnetic radio-frequency interference (EMI/RFI) issues for stacked multi-chip packages (sMCPs) for highly integrated device applications. Stacked semiconductor package substrates carry multiple chips and the stacked semiconductor package substrate are spaced apart by vertical stiffeners that also carry multiple chips, including radio-frequency chips. Consequently, the sMCP embodiments include vertical-device stiffeners that are assembled to stacked semiconductor package substrates, and multiple chips are configured on both the semiconductor package substrates and the vertical-device stiffeners.

Disclosures include increased device-integration density with both RF-signaling shielding and heat-generation package-warpage issues addressed. Reduced form-factors are disclosed with orthogonally configured devices on vertical-device stiffeners that address the increased device-integration density, the RF-signaling shielding and the heat-generation warpage issues. The orthogonally configured devices are also referred to as vertical devices on disclosed vertical-device stiffeners. The stiffeners disclosed are also referred to as vertical-device stiffeners. The disclosed techniques are applied to coreless semiconductor package substrates. The disclosed techniques are applied to thin-core semiconductor package substrates.

FIG. 1A is a cross-section elevation of a vertical-device stiffener 101 during fabrication according to an embodiment. A metal blank 10 is prepared for processing including to insulate the metal blank 10, as well as to fabricate insulated traces, and when useful, electrical through-stiffener vias (TStVs) according to an embodiment. In an embodiment, the metal blank 10 is an aluminum-containing material. In an embodiment, the metal blank 10 is a copper-containing material. In an embodiment, the blank 10 is a carbon fiber-containing material. In an embodiment, the metal blank 10 is a silver-containing material. In an embodiment, where the blank 10 is a rigid structure that acts as a stiffener, it is a ceramic blank 10. In an embodiment, the thickness of the metal blank ranges in between 100 micrometer ($\mu m$) to 1000 $\mu m$.

FIG. 1B is a cross-section elevation of the vertical-device stiffener 101 depicted in FIG. 1A after further processing according to an embodiment. The vertical-device stiffener 102 has been drilled with a through hole 110 that passes through the metal blank 10. The through-hole 110 will provide a through-stiffener via (TStV) for communication between devices on opposite sides of the vertical-device stiffener 102 (see FIG. 1F). In an embodiment, a reference voltage e.g., ground (Vss) reference voltage or power is supplied to the devices on opposite sides of the vertical-device stiffener 102 through the TStV.

FIG. 1C is a cross-section elevation of the vertical-device stiffener 102 depicted in FIG. 1B after further processing according to an embodiment. The vertical-device stiffener 103 has been processed by applying a base dielectric 112 within the through hole 110 (see FIG. 1B), as well as on a processor- or first side 114, and on a radio- or second side 116 that is opposite the processor- or first side 114. As described herein, the first side 114 is configured to vertically carry devices such as semiconductive processors, and the second side is configured to vertically carry devices such as radio-frequency integrated circuits (RFICs). The metallic nature of the blank 10 (associates with a reference voltage e.g., ground (Vss) reference voltage) acts to protect the first-side devices from the relatively noisy RFI/EMI second-side devices.

FIG. 1D is a cross-section elevation of the vertical-device stiffener 103 depicted in FIG. 1C after further processing according to an embodiment. The vertical-device stiffener 104 has been processed by opening the through hole 110 depicted in FIG. 1B, as an insulated through hole 111 including a through-hole insulation 115. In an embodiment, the first side 114, the second side 116 and the through-hole insulation 115 are a single, continuous structure. In an embodiment, a through-hole without the base dielectric 112 layer (not shown) is configured through example a drilling process to allow the TStV that carries a reference voltage e.g., ground (Vss) reference voltage, to directly contact the vertical-device stiffener to provide electrical shielding.

FIG. 1E is a cross-section elevation of the vertical-device stiffener 104 depicted in FIG. 1D after further processing according to an embodiment. The vertical-device stiffener 105 has been processed by plating a metallic layer 118 over the first side 114 of the dielectric, over the second side 116 and as well as upon the material of the through-hole insulation 115.

FIG. 1F is a cross-section elevation of the vertical-device stiffener 105 depicted in FIG. 1E after further processing according to an embodiment. The vertical-device stiffener 106 has been processed by patterning the metallic layer 118 (see FIG. 1E) to achieve several structures including bond-pad structures 120, 122, 124 and 126. Further by patterning the metallic layer 118, a through-stiffener via 128 is derived from the metallic layer 118. The through-stiffener via (TStV) 128 communicates from the first side 114 to the second side 116.

FIG. 1G is a cross-section elevation of the vertical-device stiffener 106 depicted in FIG. 1F after further processing according to an embodiment. The vertical-device stiffener 107 has been processed by applying and patterning a first photoresist layer 130 on the first side 114, and a second photoresist layer 132 on the second side 116. Accordingly, the bond pads 120 and 122 are exposed through the first photoresist layer 130, and the bond pads 124 and 126 are exposed through the second photoresist layer 132. Similarly, the through-stiffener via 128 communicates through the respective first and second photoresist layers 130 and 132 at the respective first and second sides 114 and 116. In an embodiment, a plurality of metallic and insulation layers are disposed on the respective first and second sides 114 and 116.

FIG. 2 is a cross-section elevation of a stacked multi-semiconductor device package 200 according to several embodiments. The package 200 may be referred to as a stacked multi-chip package (sMCP) 200. By comparison to structures illustrated and described in FIGS. 1A through 1G, the X-Z coordinates are rotated to preserve the Z-direction for the vertical as understood for vertical-device stiffener embodiments in this disclosure.

A first vertical-device stiffener 20 and a subsequent vertical-device stiffener 22 are disposed on a land-side semiconductor package substrate 240 according to an embodiment. In an embodiment, the land-side semiconductor package substrate 240 includes an sMCP side 237, also referred to as a first side 237, and a board side 239, also referred to as a second side 238. The first vertical-device stiffener 20 is configured on the first side 237, orthogonal to the surface of the first side 237. In an embodiment, the first side 237 is referred to as a first surface 237. In an embodiment, the board side 239 is referred to as a second side 237.

The reference numbers 20 and 22 analogously point to processed metal blanks 20 and 22 such as the processed metal blank 10 depicted in FIG. 1G. The processed metal blanks 20 and 22 may be referred to as metallic cores 20 and 22. The entire structure of the respective first and subsequent vertical-device stiffeners 20 and 22, includes more than the respective metal blanks 20 and 22, including but not limited to insulation structures, bond-pad structures, insulated traces and through-stiffener interconnects.

A stacked semiconductor package substrate 242 is assembled to the respective first and subsequent vertical-device stiffeners 20 and 22, and to the land-side semiconductor package substrate 240, to complete bridging of the respective first and subsequent vertical-device stiffeners 20 and 22, between the respective land-side and stacked semiconductor package substrates 240 and 242. The stacked semiconductor package substrate 242 includes a semiconductive device side 241, also referred to as a first side 241, and a radio side 243, also referred to as a second side 243. The first side 241 is also referred to as a processor surface 241.

In an embodiment, the first vertical-device stiffener 20 includes a first side 214 and a second side 216, which reference numbers are also analogously related to the processor- or first side 114, and the radio- or second side 116 as depicted in FIGS. 1B through 1G. Similarly, the reference numerals 214 and 216 point to processed dielectric materials that insulate the metal blanks 20 and 22 from electrical connections, including through-stiffener interconnects 228.

In an embodiment, the first vertical-device stiffener 20, bridges between the land-side semiconductor package substrate 240 and the stacked semiconductor package substrate 242. The first vertical-device stiffener 20 carries a vertically arranged stack of semiconductive devices 246 and 248 on the processor or first side 214. In an embodiment, the vertical semiconductive devices 246 and 248 are stacked memory dice 246 and 248, using a through-silicon via interconnect 247 (three occurrences illustrated) within the memory die 246 to contact the memory die 248. The vertical semiconductive devices 246 and 248 are coupled to the first vertical-device stiffener 20 with embedded insulated traces 230. Although several insulated traces are illustrated on the die side 214, an exemplary die-side vertical-stiffener insulated trace 230 is depicted as an electrical coupling to the semiconductor devices 246 and 248.

In an embodiment, the first vertical-device stiffener 20 carries a first radio-frequency integrated circuit (RFIC) device 250 on the radio- or second side 216. In an embodiment, communication between the vertically arranged die 246 and the first RFIC device 250 is accomplished by the through-stiffener via 228. In an embodiment, a reference voltage e.g., ground (Vss) reference voltage or power is supplied to the semiconductor devices 246 and 248 on the first side 214 and the first RFIC device 250 on the second side 216 through the through-stiffener via 228. In an embodiment, for communication between the land-side semiconductor package substrate 240 and the stacked semiconductor package substrate 242, at least one insulated trace (either the trace 230 or the trace 232) is present in the vertical-device stiffener. Similarly in an embodiment, for communication between the land-side semiconductor package substrate 240 and a vertical semiconductive device 246, at least one insulated trace 230 is present within the vertical-device stiffener 20. Similarly in an embodiment, for communication between a vertical semiconductive device 246 and a vertical radio-frequency device 250, at least one TStV 228 is present within the vertical-device stiffener 20. In an embodiment, the first vertical-device stiffener 20 is coupled to a reference voltage source e.g., ground (Vss) reference voltage source in the land-side semiconductor devices 256 and 258 through at least one insulated trace 230 and 232 and a circuitry (not shown) in the land-side semiconductor package substrate 240. In an embodiment, the TStV that carries the reference voltage is in direct contact (i.e. without the base dielectric layer such as dielectric layer 112 depicted in FIG. 1C) with the vertical-device stiffener 20 to provide electrical shielding.

The first RFIC device 250 is coupled to the first vertical-device stiffener 20 with embedded traces 232 on the second side 216. Although several traces are illustrated on the radio side 216, an exemplary radio-side vertical-stiffener insulated trace 232 is depicted as an electrical coupling to the radio-frequency integrated circuit 250.

In an embodiment, the subsequent vertical-device stiffener 22, bridges between the land-side semiconductor package substrate 240 and the stacked semiconductor package substrate 242. The subsequent vertical-device stiffener 22 carries a vertically arranged semiconductive device 252 on the processor or first side 214'. In an embodiment, the semiconductive device 252 is a sensor die 252. The semiconductive device 252 is coupled to the subsequent vertical-device stiffener 22 with embedded traces 230'.

In an embodiment, the subsequent vertical-device stiffener 22 carries a subsequent radio-frequency integrated circuit (RFIC) device 254 on the radio or second side 216'. In an embodiment, communication between the vertically arranged die 252 and the subsequent RFIC device 254 is accomplished by a through-stiffener via 228'. In an embodiment, a reference voltage e.g., ground (Vss) reference voltage or power is supplied to the vertically arranged die 252 on the first side 214' and the subsequent RFIC device 254 on the second side 216' through the through-stiffener via 228'.

The subsequent RFIC device 254 is coupled to the subsequent vertical-device stiffener 22 with embedded traces 232'. Although several traces are illustrated on the radio side 216', an exemplary radio-side vertical-stiffener trace 232' is depicted as an electrical coupling to the subsequent radio-frequency integrated circuit device 254. In an embodiment, the subsequent vertical-device stiffener 22 is coupled to a reference voltage source e.g., ground (Vss) reference voltage source in the land-side semiconductor devices 256 and 258 through at least one insulated trace 230' and 232' and a circuitry (not shown) in the land-side semiconductor package substrate 240. In an embodiment, the TStV that carries the reference voltage is in direct contact (i.e. without the base dielectric layer such as dielectric layer 112 depicted in FIG. 1C) with the vertical-device stiffener 22 to provide electrical shielding.

In an embodiment, the land-side semiconductor package substrate 240 carries a first bottom semiconductive device 256 such as a central-processing unit (CPU) 256. In an embodiment, the first bottom semiconductive device 256 is a system-on-chip (SOC) 256 such as a multiple-core processor made by Intel Corporation of Santa Clara, Calif. In an embodiment, the first bottom semiconductive device 256 shares space on the first side 237 of the land-side semiconductor package substrate 240, with a subsequent bottom semiconductive device 258 such as a platform-controller hub (PCH) 258. As illustrated, the first vertical-device stiffener 20 and the subsequent vertical-device stiffener 22 are spaced apart by at least the landed semiconductive device 256. In an embodiment, the vertically arranged die 252 and the subsequent RFIC device 254 are coupled to the land-side semiconductor devices 256 and 258 through at least one insulated trace 230' and 232', solder bump and circuitry (not shown) in the land-side semiconductor package substrate 240.

In an embodiment, the stacked semiconductor package substrate 242 is coupled to both the first vertical-device stiffener 20 and the subsequent vertical-device stiffener 22. In an embodiment, the stacked semiconductor package substrate 242 carries an opossum-style first suspended semiconductive device 260 such as a solid-state memory drive 260 (SSD). In an embodiment, more than one suspended semiconductive device is mounted on the stacked semiconductor package substrate 242 similarly as the SSD 260, such as is seen on the respective first and subsequent semiconductive devices 256 and 258 on the land-side semiconductor package substrate 240.

In an embodiment, a third and a fourth RFIC devices 262 and 264 are assembled on the stacked semiconductor package substrate 242 and on the second or radio side 243, which is opposite the location of the first suspended semiconductive device 260, mounted on the first or processor side 241.

As illustrated the RFIC devices 250, 254, 262 and 264 are mounted externally with respect to the semiconductive devices 246, 248, 252, 256, 258 and 260. Whereas RFIC devices may have significant electromagnetic "noise" such as is called electromagnetic interference (EMI) or radio-frequency interference (RFI), the configuration of the vertical stiffeners 20 and 22 along with useful structures within the semiconductor package substrates 240 and 242, act as EMI/RFI shielding to protect sensitive circuitry of any, or all of the several semiconductive devices 246, 248, 252, 256, 258 and 260.

As illustrated, the RFICs 250, 254, 262 and 264 have an array configuration that is at least 2-dimensional within the plane of the drawing, where they approximate a 180° array layout with respect to a board 266 such as a motherboard onto which the stacked multi-chip package 200. In an embodiment, the board 266 includes a shell 268 that provides both physical and dielectric protection to the sMCP 200.

The several semiconductive devices that are within the enclosed region made by the semiconductor package substrates 240 and 242 and the vertical-device stiffeners 20 and 22, may be relationally referred to as landed devices 256 and 258, a hanging device 260, and vertical devices 246, 248 and 252.

Figure 3:
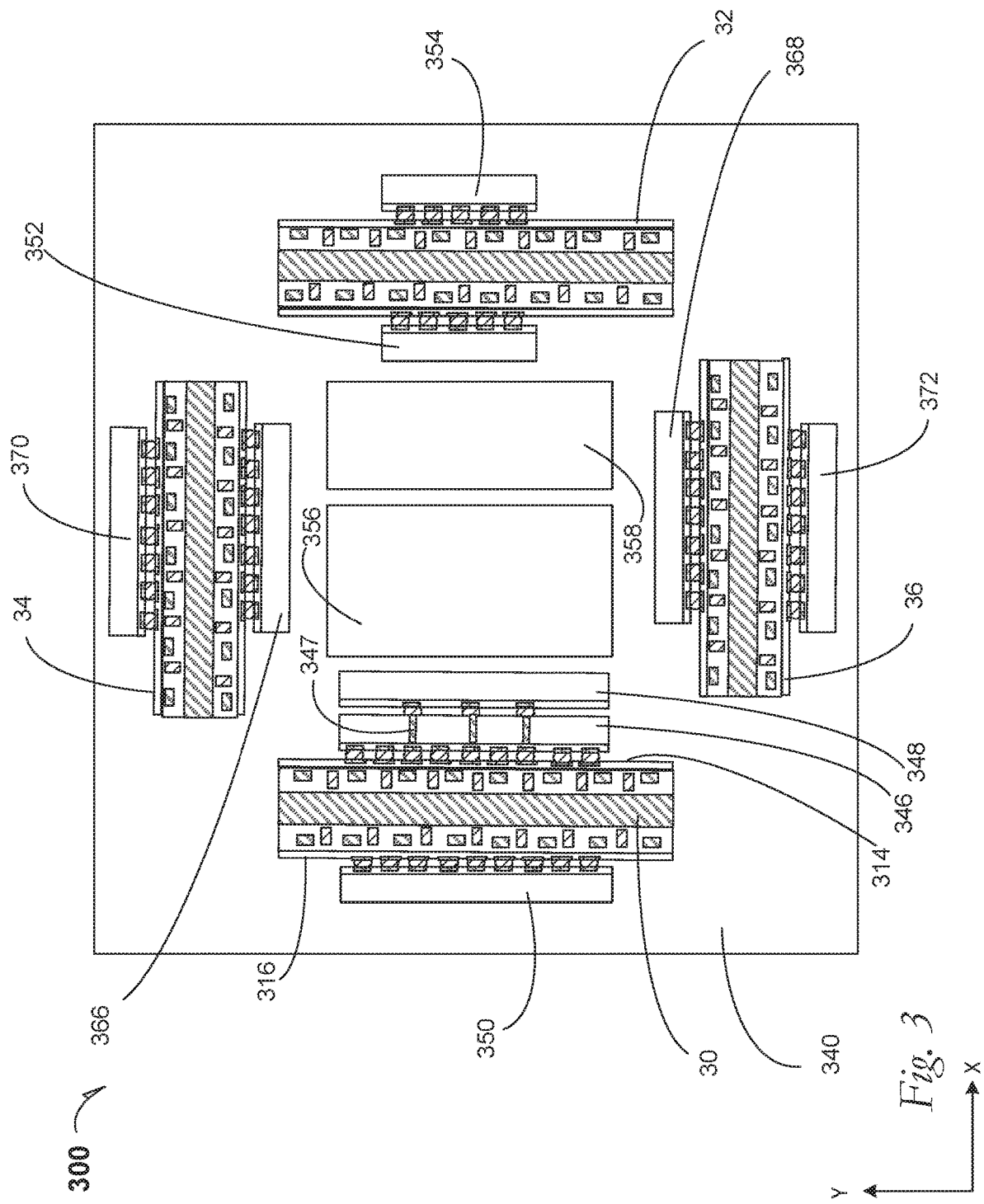
FIG. 3 is a top plan of a stacked multi-semiconductor device package according to several embodiments.

FIG. 3 is a top plan of a stacked multi-semiconductor device package 300 according to several embodiments. The package 300 may be referred to as a stacked multi-chip package (sMCP) 300. By comparison to structures illustrated and described in FIGS. 1A through 1G, and FIG. 2, the X-Z coordinates are transformed to X-Y coordinates and the Z-direction (vertical direction) is orthogonal to the drawing sheet. Further, no stacked semiconductor package substrate is depicted (see, e.g. item 242 in FIG. 2), to reveal landed structures assembled on a land-side semiconductor package substrate 340 and vertical structures on the vertical-device stiffeners.

In an embodiment, a given vertical-device stiffener has three characteristic dimensions of a solid rectangle or obilisk. By comparing depictions among FIGS. 1A through 1G. FIG. 2, and FIG. 3, a minimum characteristic dimension is observed for the X-dimension, a medium characteristic dimension is observed for the Z-direction and a maximum characteristic dimension is observed for the Y-direction. The minimum and maximum characteristic dimensions describe one surface that contacts a land-side semiconductor package substrate 340 and the medium and minimum characteristic dimensions describe two surfaces that extend orthogonally and vertically from a land-side semiconductor package substrate toward a stacked semiconductor package substrate.

A first vertical-device stiffener 30, a subsequent vertical-device stiffener 32, a third vertical-device stiffener 34 and a fourth vertical-device stiffener 36 are disposed on a land-side semiconductor package substrate 340 according to an embodiment. The reference numbers 30 and 32 analogously point to the vertical-device stiffeners 20 and 22 depicted in FIG. 2. The entire structure of the respective first and subsequent vertical-device stiffeners 30 and 32, as well as the third and fourth vertical-device stiffeners 34 and 36 include more than the processed metal blanks, including but not limited to insulation structures, bond-pad structures, insulated traces and through-stiffener interconnects among others where useful. The first and subsequent vertical-device stiffeners 30 and 32 include minimum and maximum characteristic dimensions that are described along the respective X and Y directions. The third and fourth vertical-device stiffeners 34 and 36 include minimum and maximum characteristic dimensions that are described along the respective Y and X directions.

In an embodiment, vertical and stacked semiconductive devices 346 and 348 are configured on a first side 314 of the first vertical-device stiffener 30, and a vertical RFIC device 350 is configured on a second side 316. Similarly, a subsequent vertical semiconductive device 352 is assembled on the subsequent vertical device stiffener 32, and a vertical RFIC device 354 is configured opposite the semiconductive device 352. Similarly, a third vertical semiconductive device 366 is assembled on the third vertical device stiffener 34, and a vertical RFIC device 370 is configured opposite the semiconductive device 366. Similarly, a fourth vertical semiconductive device 368 is assembled on the fourth vertical device stiffener 36, and a fourth vertical RFIC device 372 is configured opposite the fourth vertical semiconductive device 368.

In an embodiment, semiconductive devices 346 and 348 are vertical and stacked memory dice 346 and 348 that are assembled onto the first side 314 of the first vertical device stiffener 30, using a through-silicon via interconnect 347 (three occurrences illustrated) within the memory die 346 to contact the memory die 348. The semiconductive devices 346 and 348 are coupled to the first vertical-device stiffener 30 with embedded traces.

In an embodiment, the land-side semiconductor package substrate 340 carries a first bottom (or landed) semiconductive device 356 such as a central-processing unit (CPU) 356. In an embodiment, the first bottom semiconductive device 356 is a system-on-chip (SOC) 356 such as a multiple-core processor made by Intel Corporation of Santa Clara, Calif. In an embodiment, the first bottom semiconductive device 356 shares space on the land-side semiconductor package substrate 340 with a subsequent bottom (or landed) semiconductive device 358 such as a platform-controller hub (PCH) 358. In an embodiment, the semiconductor devices 346 and 348 are coupled to the land-side semiconductor devices 356 and 358 through the embedded traces (such as trace 230 in FIG. 2), solder bump and circuitry in the land-side semiconductor package substrate 340.

Figure 4:
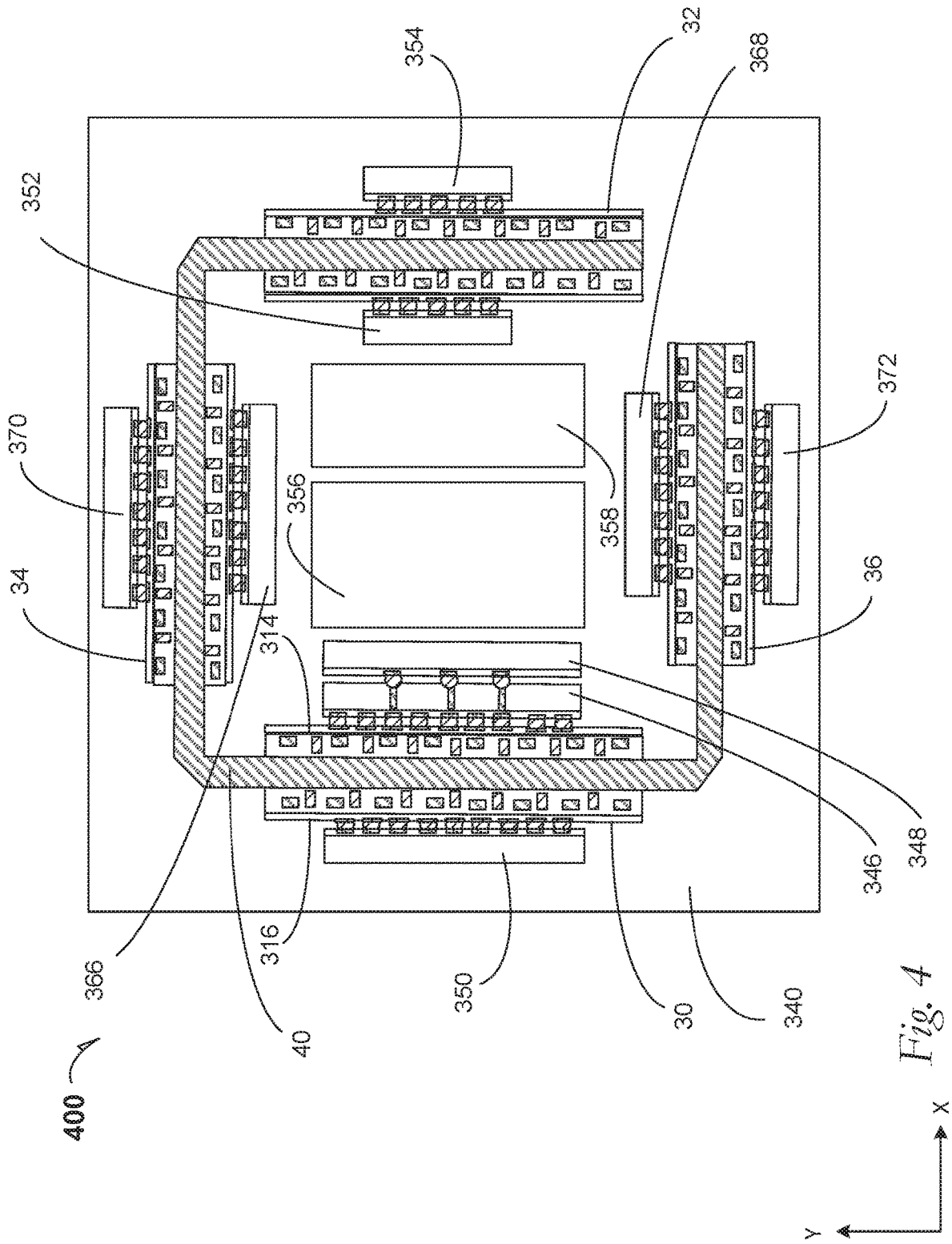
FIG. 4 is a top plan of a stacked multi-chip device package according to several embodiments.

FIG. 4 is a top plan of a stacked multi-chip device package 400 according to several embodiments. The package 400 may be referred to as a stacked multi-chip package (sMCP) 400. Many reference numbers and descriptions from FIG. 3 are preserved in FIG. 4, with the variation that the reference numbers 30, 32, 34 and 36 indicate generically to vertical-device stiffeners and not processed metal blanks.

In an embodiment, the several metal structures of the vertical-device stiffeners 30, 32, 34 and 36, although they represent discrete vertical-device stiffeners, are replaced by a single stiffener body 40, with four regions of vertical-device stiffeners 30, 32, 34 and 36, similar to the sMCP 300 depicted in FIG. 3. In an embodiment, two vertical-device stiffeners such as the stiffeners 30 and 36 are part of an integral stiffener body (forming an approximate "L" shape). In an embodiment, three vertical-device stiffeners such as the stiffeners 36, 30 and 34 are part of an integral stiffener body (forming an approximate "U" shape).

Figure 5:
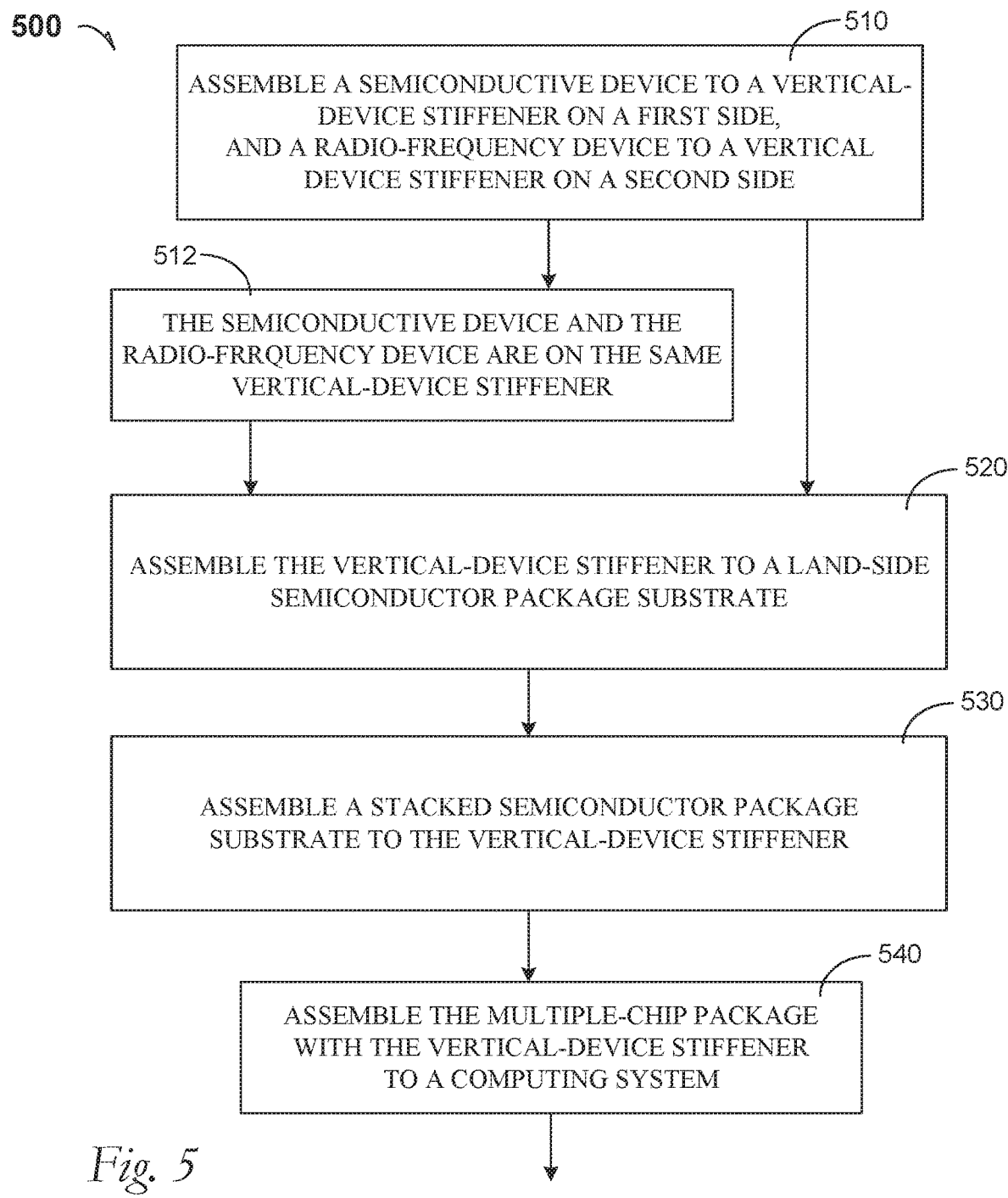
FIG. 5 is a process flow diagram according to several embodiments.

FIG. 5 is a process flow diagram according to several embodiments.

At 510, the process includes assembling a semiconductive device to a vertical-device stiffener on a first side, and assembling a radio-frequency device to a vertical-device stiffener on a second side.

At 512, the semiconductive device and the radio-frequency device are on the same vertical-device stiffener. In a non-limiting example embodiment, the semiconductive device 246 is assembled to a first side 214 of a first vertical-device stiffener 20, and a radio-frequency device 254 is assembled to a second side 216' of a subsequent vertical-device stiffener 22. In a non-limiting example embodiment, the semiconductive device 246 is assembled to a first side 214 of a first vertical-device stiffener 20, and a radio-frequency device 250 is assembled to a second side 216 of the vertical-device stiffener 20.

At 520, the process includes assembling the vertical-device stiffener to a bottom semiconductor package substrate.

At 530, the process includes assembling a stacked semiconductor package to the vertical-device stiffener.

At 540, the process includes assembling the stacked multiple chip package with the vertical-device stiffener to a computing system.

Figure 6:
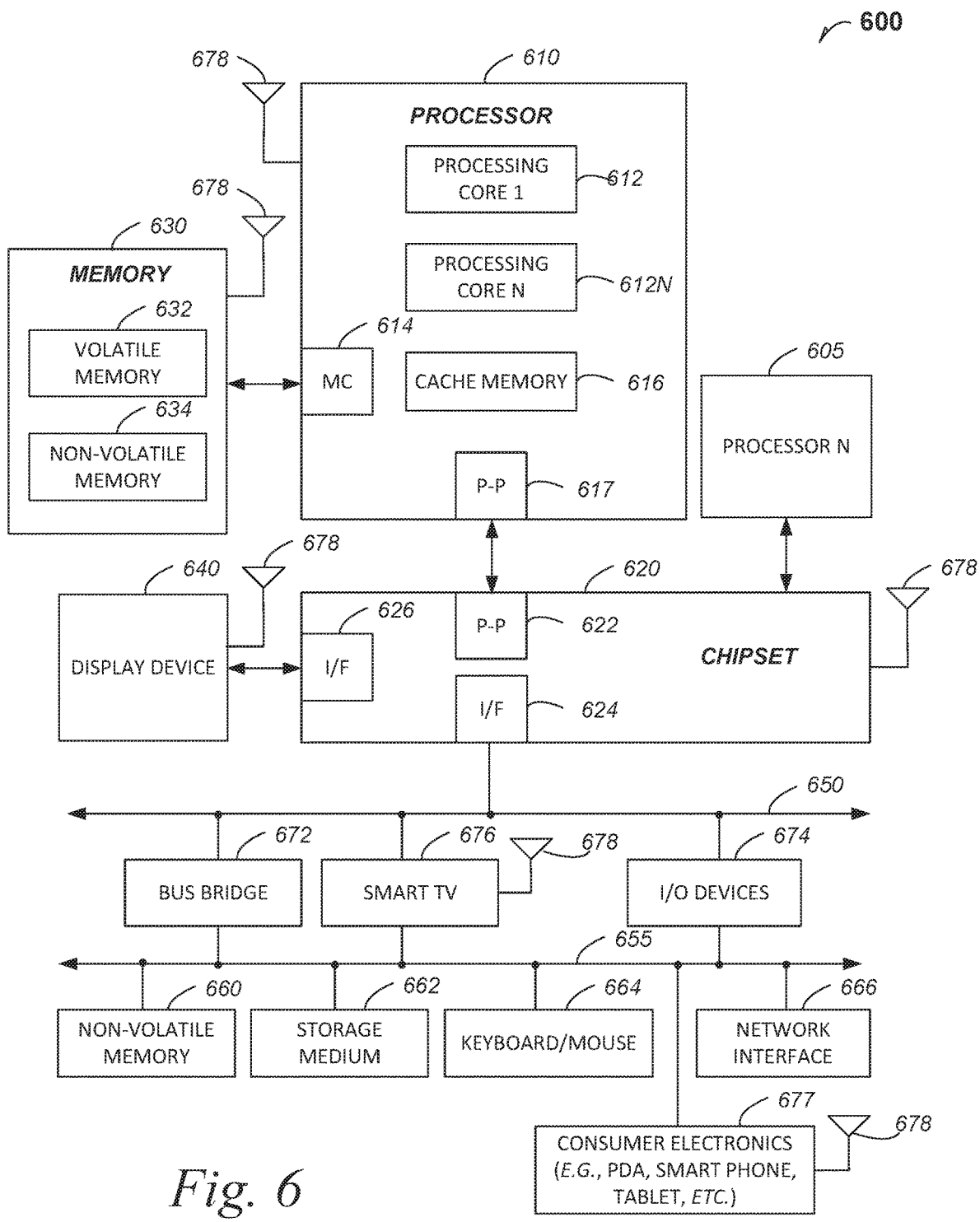
FIG. 6 is included to show an example of a higher-level device application for the disclosed embodiments.

FIG. 6 is included to show an example of a higher-level device application for the disclosed embodiments. The stacked multiple chip package embodiments may be found in several parts of a computing system. In an embodiment, the stacked multiple chip package embodiments can be part of a communications apparatus such as is affixed to a cellular communications tower. In an embodiment, a computing system 600 includes, but is not limited to, a desktop computer. In an embodiment, a computing system 600 includes, but is not limited to a laptop computer. In an embodiment, a computing system 600 includes, but is not limited to a tablet. In an embodiment, a computing system 600 includes, but is not limited to a notebook computer. In an embodiment, a computing system 600 includes, but is not limited to a personal digital assistant (PDA). In an embodiment, a computing system 600 includes, but is not limited to a server. In an embodiment, a computing system 600 includes, but is not limited to a workstation. In an embodiment, a computing system 600 includes, but is not limited to a cellular telephone. In an embodiment, a computing system 600 includes, but is not limited to a mobile computing device. In an embodiment, a computing system 600 includes, but is not limited to a smart phone. In an embodiment, a system 600 includes, but is not limited to an internet appliance. Other types of computing devices may be configured with the microelectronic device that includes stacked multiple chip package embodiments.

In an embodiment, the processor 610 has one or more processing cores 612 and 612N, where 612N represents the Nth processor core inside processor 610 where N is a positive integer. In an embodiment, the electronic device system 600 using a stacked multiple chip package embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the stacked multiple chip package embodiment in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of a stacked multiple chip package embodiment depicted in any of FIG. 2, 3 or 4. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a semiconductor package-embedded thin-film capacitor and package-integral magnetic inductor embodiment as set forth in this disclosure. The chipset 620 enables the processor 610 to connect to other elements in a semiconductor package-embedded thin-film capacitor and package-integral magnetic inductor embodiment in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into a stacked multiple chip package embodiment in a system. Additionally, the chipset 620 connects to one or more buses 650 and 655 that interconnect various elements 674, 660, 662, 664, and 666. Buses 650 and 655 may be interconnected together via a bus bridge 672 such as at least one stacked multiple chip package embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid-state drive, a hard disk drive, a universal serial bus flash memory drive, or any other form of computer data storage medium. In one embodiment, the network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the stacked multiple chip package embodiments in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

To illustrate the stacked multiple chip package stacked multiple chip package embodiments and methods disclosed herein, a non-limiting list of examples is provided herein:

Example 1 is a semiconductor device package, comprising: a land-side semiconductor package substrate including a first surface and a second surface opposite the first surface; a vertical-device stiffener on the land-side semiconductor package substrate, wherein the vertical-device stiffener includes a processor side and a radio-frequency side, wherein the vertical-device stiffener is on and orthogonal to the land-side semiconductor package substrate first surface, and wherein the vertical-device stiffener includes an insulated trace on the processor side; a vertical semiconductive device on the vertical-device stiffener processor side, wherein the vertical semiconductor device is orthogonal to the land-side semiconductor package substrate first surface, and wherein the insulated trace is coupled to the vertical semiconductive device; and a radio-frequency integrated circuit device on the vertical-device stiffener radio-frequency side.

In Example 2, the subject matter of Example 1 optionally includes a stacked semiconductor-package substrate on the vertical-device stiffener, wherein the stacked semiconductor-package substrate includes a processor surface attached at the vertical-device stiffener; and a semiconductive device on the stacked semiconductor-package substrate processor surface.

In Example 3, the subject matter of any one or more of Examples 1-2 optionally include wherein the vertical-device stiffener is a first vertical-device stiffener, further including: a subsequent vertical-device stiffener on the land-side semiconductor package substrate first surface, wherein the subsequent vertical-device stiffer includes a processor side and a radio-frequency side, wherein the subsequent vertical-device stiffener is on and orthogonal to the land-side semiconductor package substrate first surface; a subsequent vertical semiconductive device on the subsequent vertical-device stiffener processor side, wherein the subsequent vertical semiconductor device is orthogonal to the land-side semiconductor package substrate first surface; and a subsequent radio-frequency integrated circuit device on the subsequent vertical-device stiffener radio-frequency side.

In Example 4, the subject matter of any one or more of Examples 1-3 optionally include wherein the vertical-device stiffener is a first vertical-device stiffener, further including: a landed semiconductive device on the first surface; a subsequent vertical-device stiffener on the land-side semiconductor package substrate first surface, wherein the subsequent vertical-device stiffer includes a processor side and a radio-frequency side, wherein the subsequent vertical-device stiffener is on and orthogonal to the land-side semiconductor package substrate first surface; a subsequent vertical semiconductive device on the subsequent vertical-device stiffener processor side, wherein the subsequent vertical semiconductor device is orthogonal to the land-side semiconductor package substrate first surface; a subsequent radio-frequency integrated circuit device on the subsequent vertical-device stiffener radio-frequency side; a stacked semiconductor-package substrate on the first vertical-device stiffener and the subsequent vertical-device stiffener, wherein the stacked semiconductor-package substrate includes a processor surface attached at the first vertical-device stiffener and the subsequent vertical-device stiffener; and a hanging semiconductive device on the stacked semiconductor-package substrate between the first vertical-device stiffener and the subsequent vertical-device stiffener.

In Example 5, the subject matter of any one or more of Examples 1-4 optionally include wherein the vertical-device stiffener includes a metallic core, further including a through-stiffener via that passes through the metallic core, wherein the through-stiffener via couples the vertical semiconductive device, to the radio-frequency integrated circuit device.

In Example 6, the subject matter of any one or more of Examples 1-5 optionally include wherein the vertical-device stiffener includes a metallic core, further including: a through-stiffener via that passes through the metallic core, wherein the through-stiffener via couples the vertical semiconductive device, to the radio-frequency integrated circuit device; and a stacked semiconductive device on the vertical semiconductive device, wherein the vertical semiconductive device and the stacked semiconductive device are coupled by a through-silicon via interconnect in the vertical semiconductive device.

In Example 7, the subject matter of any one or more of Examples 1-6 optionally include wherein the vertical-device stiffener includes a metallic core, further including: a through-stiffener via that passes through the metallic core, wherein the through-stiffener via couples the vertical semiconductive device, to the radio-frequency integrated circuit device; a stacked semiconductive device on the vertical semiconductive device, wherein the vertical semiconductive device and the stacked semiconductive device are coupled by a through-silicon via interconnect in the vertical semiconductive device; wherein the vertical semiconductive device is coupled on the processor side, between the land-side semiconductor package substrate and the stacked semiconductor-package substrate, with an insulated trace that couples to the land-side semiconductor package substrate, and an insulated trace that couples to the stacked semiconductor-package substrate.

In Example 8, the subject matter of any one or more of Examples 1-7 optionally include wherein the vertical-device stiffener includes a metallic core, further including: a through-stiffener via that passes through the metallic core, wherein the through-stiffener via couples the vertical semiconductive device, to the radio-frequency integrated circuit device; a stacked semiconductive device on the vertical semiconductive device, wherein the vertical semiconductive device and the stacked semiconductive device are coupled by a through-silicon via interconnect in the vertical semiconductive device; wherein the radio-frequency integrated circuit device is coupled on the radio side, between the land-side semiconductor package substrate and the stacked semiconductor-package substrate, with an insulated trace that couples to the land-side semiconductor package substrate, and an insulated trace that couples to the stacked semiconductor-package substrate.

In Example 9, the subject matter of any one or more of Examples 1-8 optionally include wherein the vertical-device stiffener is a first vertical-device stiffener, further including: a stacked semiconductor-package substrate on the first vertical-device stiffener, wherein the stacked semiconductor-package substrate includes a processor surface attached at the first vertical-device stiffener a subsequent vertical-device stiffener on the land-side semiconductor package substrate first surface, wherein the subsequent vertical-device stiffer includes a processor side and a radio-frequency side, wherein the subsequent vertical-device stiffener is on and orthogonal to the land-side semiconductor package substrate first surface; a subsequent vertical semiconductive device on the subsequent vertical-device stiffener processor side, wherein the subsequent vertical semiconductor device is orthogonal to the land-side semiconductor package substrate first surface; a subsequent radio-frequency integrated circuit device on the subsequent vertical-device stiffener radio-frequency side; and a radio-frequency integrated circuit device on the stacked semiconductor package substrate on a surface opposite the processor surface.

In Example 10, the subject matter of Example 9 optionally includes wherein the subsequent vertical-device stiffener includes a metallic core, further including a through-stiffener via that passes through the metallic core, wherein the through-stiffener via couples the subsequent vertical semiconductive device, to the subsequent radio-frequency integrated circuit device.

In Example 11, the subject matter of any one or more of Examples 9-10 optionally include wherein the subsequent vertical-device stiffener includes a metallic core coupled to a reference voltage within the land-side semiconductor package substrate, further including a through-stiffener via that passes through the metallic core, wherein the through-stiffener via couples the subsequent vertical semiconductive device, to the subsequent radio-frequency integrated circuit device.

In Example 12, the subject matter of any one or more of Examples 9-11 optionally include wherein the subsequent vertical-device stiffener includes a metallic core, further including: a through-stiffener via that passes through the metallic core, wherein the through-stiffener via couples the subsequent vertical semiconductive device, to the subsequent radio-frequency integrated circuit device; wherein the subsequent vertical semiconductive device is coupled on the processor side, between the land-side semiconductor package substrate and the stacked semiconductor-package substrate, with a trace that couples to the land-side semiconductor package substrate, and a trace that couples to the stacked semiconductor-package substrate.

In Example 13, the subject matter of any one or more of Examples 9-12 optionally include wherein the subsequent vertical-device stiffener includes a metallic core, further including: a through-stiffener via that passes through the metallic core, wherein the through-stiffener via couples the subsequent vertical semiconductive device, to subsequent the radio-frequency integrated circuit device; wherein the subsequent radio-frequency integrated circuit device is coupled on the radio side, between the land-side semiconductor package substrate and the stacked semiconductor-package substrate, with a trace that couples to the land-side semiconductor package substrate, and a trace that couples to the stacked semiconductor-package substrate.

In Example 14, the subject matter of any one or more of Examples 9-13 optionally include wherein the subsequent vertical-device stiffener includes a metallic core, further including: a first semiconductive device on the first surface; a subsequent bottom semiconductive device on the first surface and adjacent the first semiconductive device; a through-stiffener via that passes through the metallic core, wherein the through-stiffener via couples the subsequent vertical semiconductive device, to a subsequent radio-frequency integrated circuit device; wherein the subsequent radio-frequency integrated circuit device is coupled on the radio side, between the land-side semiconductor package substrate and the stacked semiconductor-package substrate, with an insulated trace that couples to the land-side semiconductor package substrate, and an insulated trace that couples to the stacked semiconductor-package substrate.

In Example 15, the subject matter of any one or more of Examples 9-14 optionally include wherein the subsequent vertical-device stiffener includes a metallic core, further including: a first semiconductive device on the first surface; a subsequent bottom semiconductive device on the first surface and adjacent the first semiconductive device; a through-stiffener via that passes through the metallic core, wherein the through-stiffener via couples the subsequent vertical semiconductive device, to subsequent the radio-frequency integrated circuit device; wherein the subsequent radio-frequency integrated circuit device is coupled on the radio side, between the land-side semiconductor package substrate and the stacked semiconductor-package substrate, with a trace that couples to the land-side semiconductor package substrate, and a trace that couples to the stacked semiconductor-package substrate; and a hanging semiconductor device on the stacked semiconductor package substrate at the processor side.

In Example 16, the subject matter of any one or more of Examples 1-15 optionally include a board contacting the land-side semiconductor package substrate at the second surface; a bottom semiconductive device on the land-side semiconductor package substrate at the first surface; and wherein the bottom semiconductive device is part of a chipset in a computing system.

Example 17 is a stacked multi-chip package, comprising: a land-side semiconductor package substrate including a first surface and a second surface opposite the first surface; a landed semiconductive device on the first surface; a first vertical-device stiffener including a first side and a second side, and wherein the first vertical-device stiffener includes an insulated trace on the first side; a first semiconductive device on the first vertical-device stiffener first side; a subsequent vertical-device stiffener, wherein the first and subsequent vertical-device stiffeners are spaced apart by the landed semiconductive device; a stacked semiconductor package substrate including a semiconductive device side and a radio side, wherein the stacked semiconductor package contacts each of the first vertical-device stiffener, and the subsequent vertical-device stiffener on the semiconductive device side; and a semiconductive device on the stacked semiconductor package substrate semiconductive device side.

In Example 18, the subject matter of Example 17 optionally includes a third vertical-device stiffener on the first surface, wherein the third vertical-device stiffener includes a first side and a second side, and wherein the third vertical-device stiffener includes an insulated trace on the first side; a fourth vertical-device stiffener on the first surface, wherein the third and fourth vertical-device stiffeners are arrayed on the first surface and are spaced apart by the landed semiconductive device.

In Example 19, the subject matter of any one or more of Examples 17-18 optionally include a first radio-frequency device on the first vertical-device stiffener second side, wherein a through-stiffener via passes through the first vertical-device stiffener and couples the first semiconductive device and the first radio-frequency device; a third vertical-device stiffener on the first surface, wherein the third vertical-device stiffener includes a first side and a second side, and wherein the third vertical-device stiffener includes an insulated trace on the first side; a fourth vertical-device stiffener on the first surface, wherein the third and fourth vertical-device stiffeners are arrayed on the first surface across from the bottom semiconductive device.

In Example 20, the subject matter of any one or more of Examples 17-19 optionally include a radio-frequency device on the stacked semiconductor package substrate on the radio side.

Example 21 is a process of assembling a stacked multiple-chip package, comprising: assembling a semiconductive device to a vertical-device stiffener on a first side, to couple the semiconductive device to an insulated trace on the first side; assembling the vertical-device stiffener orthogonally to a first surface of a land-side semiconductor package substrate, wherein the first surface carries a bottom semiconductive device; and assembling a stacked semiconductor package substrate orthogonally at a semiconductor device side to the vertical-device stiffener, wherein the semiconductor device side carries a hanging semiconductive device.

In Example 22, the subject matter of Example 21 optionally includes wherein the vertical-device stiffener includes a second side, further including assembling a radio-frequency device to the vertical-device stiffener on the second side, to couple to an embedded trace on the second side.

In Example 23, the subject matter of any one or more of Examples 21-22 optionally include wherein the vertical-device stiffener is a first vertical-device stiffener, further including: assembling a subsequent semiconductive device to a subsequent vertical-device stiffener on a first side, to couple the subsequent semiconductive device to an insulated trace on the first side; and assembling the subsequent vertical-device stiffener orthogonally to the first surface of the land-side semiconductor package substrate, wherein first and subsequent vertical-device stiffeners are spaced apart by the bottom semiconductive device.

In Example 24, the subject matter of Example 23 optionally includes wherein the subsequent vertical-device stiffener includes a second side, further including assembling a subsequent radio-frequency device to the subsequent vertical-device stiffener on the second side, to couple to an embedded trace on the second side.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B." "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor device package, comprising:
   a land-side semiconductor package substrate including a first surface and a second surface opposite the first surface;
   a vertical-device stiffener on the land-side semiconductor package substrate, wherein the vertical-device stiffener includes a processor side and a radio-frequency side, wherein the vertical-device stiffener is on and orthogonal to the land-side semiconductor package substrate first surface, and wherein the vertical-device stiffener includes an insulated trace on the processor side;
   a vertical semiconductive device on the vertical-device stiffener processor side, wherein the vertical semiconductive device is orthogonal to the land-side semiconductor package substrate first surface, and wherein the insulated trace is coupled to the vertical semiconductive device; and
   a radio-frequency integrated circuit device on the vertical-device stiffener radio-frequency side.

2. The semiconductor device package of claim 1, further including a stacked semiconductor-package substrate on the vertical-device stiffener, wherein the stacked semiconductor-package substrate includes a processor surface attached at the vertical-device stiffener; and
   a semiconductive device on the stacked semiconductor-package substrate processor surface.

3. The semiconductor device package of claim 1, wherein the vertical-device stiffener is a first vertical-device stiffener, further including:
   a subsequent vertical-device stiffener on the land-side semiconductor package substrate first surface, wherein the subsequent vertical-device stiffer includes a processor side and a radio-frequency side, wherein the subsequent vertical-device stiffener is on and orthogonal to the land-side semiconductor package substrate first surface;
   a subsequent vertical semiconductive device on the subsequent vertical-device stiffener processor side, wherein the subsequent vertical semiconductive device is orthogonal to the land-side semiconductor package substrate first surface; and
   a subsequent radio-frequency integrated circuit device on the subsequent vertical-device stiffener radio-frequency side.

4. The semiconductor device package of claim 1, wherein the vertical-device stiffener is a first vertical-device stiffener, further including:
   a landed semiconductive device on the first surface;
   a subsequent vertical-device stiffener on the land-side semiconductor package substrate first surface, wherein the subsequent vertical-device stiffer includes a processor side and a radio-frequency side, wherein the subsequent vertical-device stiffener is on and orthogonal to the land-side semiconductor package substrate first surface;
   a subsequent vertical semiconductive device on the subsequent vertical-device stiffener processor side, wherein the subsequent vertical semiconductive device is orthogonal to the land-side semiconductor package substrate first surface;
   a subsequent radio-frequency integrated circuit device on the subsequent vertical-device stiffener radio-frequency side;

a stacked semiconductor-package substrate on the first vertical-device stiffener and the subsequent vertical-device stiffener, wherein the stacked semiconductor-package substrate includes a processor surface attached at the first vertical-device stiffener and the subsequent vertical-device stiffener; and a hanging semiconductive device on the stacked semiconductor-package substrate between the first vertical-device stiffener and the subsequent vertical-device stiffener.

5. The semiconductor device package of claim 1, wherein the vertical-device stiffener includes a metallic core, further including a through-stiffener via that passes through the metallic core, wherein the through-stiffener via couples the vertical semiconductive device, to the radio-frequency integrated circuit device.

6. The semiconductor device package of claim 1, wherein the vertical-device stiffener includes a metallic core, further including:
 a through-stiffener via that passes through the metallic core, wherein the through-stiffener via couples the vertical semiconductive device, to the radio-frequency integrated circuit device; and
 a stacked semiconductive device on the vertical semiconductive device, wherein the vertical semiconductive device and the stacked semiconductive device are coupled by a through-silicon via interconnect in the vertical semiconductive device.

7. The semiconductor device package of claim 1, wherein the vertical-device stiffener includes a metallic core, further including:
 a through-stiffener via that passes through the metallic core, wherein the through-stiffener via couples the vertical semiconductive device, to the radio-frequency integrated circuit device;
 a stacked semiconductive device on the vertical semiconductive device, wherein the vertical semiconductive device and the stacked semiconductive device are coupled by a through-silicon via interconnect in the vertical semiconductive device;
 wherein the vertical semiconductive device is coupled on the processor side, between the land-side semiconductor package substrate and a stacked semiconductor-package substrate, with an insulated trace that couples to the land-side semiconductor package substrate, and an insulated trace that couples to the stacked semiconductor-package substrate.

8. The semiconductor device package of claim 7, wherein the vertical-device stiffener includes a metallic core, further including:
 a through-stiffener via that passes through the metallic core, wherein the through-stiffener via couples the vertical semiconductive device, to the radio-frequency integrated circuit device;
 a stacked semiconductive device on the vertical semiconductive device, wherein the vertical semiconductive device and the stacked semiconductive device are coupled by a through-silicon via interconnect in the vertical semiconductive device;
 wherein the radio-frequency integrated circuit device is coupled on the radio-frequency side, between the land-side semiconductor package substrate and the stacked semiconductor-package substrate, with an a first insulated trace of a first or subsequent vertical-device stiffener that couples to the land-side semiconductor package substrate, and an a second insulated trace of the first or subsequent vertical-device stiffener that couples to the stacked semiconductor-package substrate.

9. The semiconductor device package of claim 1, wherein the vertical-device stiffener is a first vertical-device stiffener, further including:
 a stacked semiconductor-package substrate on the first vertical-device stiffener, wherein the stacked semiconductor-package substrate includes a processor surface attached at the first vertical-device stiffener
 a subsequent vertical-device stiffener on the land-side semiconductor package substrate first surface, wherein the subsequent vertical-device stiffer includes a processor side and a radio-frequency side, wherein the subsequent vertical-device stiffener is on and orthogonal to the land-side semiconductor package substrate first surface;
 a subsequent vertical semiconductive device on the subsequent vertical-device stiffener processor side, wherein the subsequent vertical semiconductive device is orthogonal to the land-side semiconductor package substrate first surface;
 a subsequent radio-frequency integrated circuit device on the subsequent vertical-device stiffener radio-frequency side; and
 a radio-frequency integrated circuit device on the stacked semiconductor package substrate on a surface opposite the processor surface.

10. The semiconductor device package of claim 9, wherein the subsequent vertical-device stiffener includes a metallic core, further including a through-stiffener via that passes through the metallic core, wherein the through-stiffener via couples the subsequent vertical semiconductive device, to the subsequent radio-frequency integrated circuit device.

11. The semiconductor device package of claim 9, wherein the subsequent vertical-device stiffener includes a metallic core coupled to a reference voltage within the land-side semiconductor package substrate, further including a through-stiffener via that passes through the metallic core, wherein the through-stiffener via couples the subsequent vertical semiconductive device, to the subsequent radio-frequency integrated circuit device.

12. The semiconductor device package of claim 9, wherein the subsequent vertical-device stiffener includes a metallic core, further including:
 a through-stiffener via that passes through the metallic core, wherein the through-stiffener via couples the subsequent vertical semiconductive device, to the subsequent radio-frequency integrated circuit device;
 wherein the subsequent vertical semiconductive device is coupled on the processor side, between the land-side semiconductor package substrate and the stacked semiconductor-package substrate, with a first, trace of the first or subsequent vertical-device stiffener that couples to the land-side semiconductor package substrate, and a second trace of the first or subsequent vertical-device stiffener that couples to the stacked semiconductor-package substrate.

13. The semiconductor device package of claim 9, wherein the subsequent vertical-device stiffener includes a metallic core, further including:
 a through-stiffener via that passes through the metallic core, wherein the through-stiffener via couples the subsequent vertical semiconductive device, to subsequent the radio-frequency integrated circuit device;

wherein the subsequent, radio-frequency integrated circuit device is coupled on the radio-frequency side, between the land-side semiconductor package substrate and the stacked semiconductor-package substrate, with a trace that couples to the land-side semiconductor package substrate, and a trace that couples to the stacked semiconductor-package substrate.

14. The semiconductor device package of claim 9, wherein the subsequent vertical-device stiffener includes a metallic core, further including:
a first semiconductive device on the first surface;
a subsequent bottom semiconductive device on the first surface and adjacent the first semiconductive device;
a through-stiffener via that passes through the metallic core, wherein the through-stiffener via couples the subsequent vertical semiconductive device, to the subsequent radio-frequency integrated circuit device;
wherein the subsequent radio-frequency integrated circuit device is coupled on the radio-frequency side, between the land-side semiconductor package substrate and the stacked semiconductor-package substrate, with a first insulated trace of the first or subsequent vertical-device stiffener that couples to the land-side semiconductor package substrate, and an a second insulated trace of the first or subsequent vertical-device stiffener that couples to the stacked semiconductor-package substrate.

15. The semiconductor device package of claim 9, wherein the subsequent vertical-device stiffener includes a metallic core, further including:
a first semiconductive device on the first surface;
a subsequent bottom semiconductive device on the first surface and adjacent the first semiconductive device;
a through-stiffener via that passes through the metallic core, wherein the through-stiffener via couples the subsequent vertical semiconductive device, to the subsequent radio-frequency integrated circuit device;
wherein the subsequent radio-frequency integrated circuit device is coupled on the radio-frequency side, between the land-side semiconductor package substrate and the stacked semiconductor-package substrate, with a trace that couples to the land-side semiconductor package substrate, and a trace that couples to the stacked semiconductor-package substrate; and
a hanging semiconductor device on the stacked semiconductor package substrate at the processor side.

16. The semiconductor device package of claim 1, further including:
a board contacting the land-side semiconductor package substrate at the second surface;
a bottom semiconductive device on the land-side semiconductor package substrate at the first surface; and
wherein the bottom semiconductive device is part of a chipset in a computing system.

17. A stacked multi-chip package, comprising:
a land-side semiconductor package substrate including a first surface and a second surface opposite the first surface;
a landed semiconductive device on the first surface;
a first vertical-device stiffener including a first side and a second side, and wherein the first vertical-device stiffener includes an insulated trace on the first side;
a first semiconductive device on the first vertical-device stiffener first side;
a subsequent vertical-device stiffener, wherein the first and subsequent vertical-device stiffeners are spaced apart by the landed semiconductive device;

a stacked semiconductor package substrate including a semiconductive device side and a radio side, wherein the stacked semiconductor package substrate contacts each of the first vertical-device stiffener, and the subsequent vertical-device stiffener on the semiconductive device side; and
a semiconductive device on the stacked semiconductor package substrate semiconductive device side.

18. The stacked multi-chip package of claim 17, further including:
a third vertical-device stiffener on the first surface, wherein the third vertical-device stiffener includes a first side and a second side, and wherein the third vertical-device stiffener includes an insulated trace on the first side;
a fourth vertical-device stiffener on the first surface, wherein the third and fourth vertical-device stiffeners are arrayed on the first surface and are spaced apart by the landed semiconductive device.

19. The stacked multi-chip package of claim 17, further including:
a first radio-frequency device on the first vertical-device stiffener second side, wherein a through-stiffener via passes through the first vertical-device stiffener and couples the first semiconductive device and the first radio-frequency device;
a third vertical-device stiffener on the first surface, wherein the third vertical-device stiffener includes a first side and a second side, and wherein the third vertical-device stiffener includes an insulated trace on the first side;
a fourth vertical-device stiffener on the first surface, wherein the third and fourth vertical-device stiffeners are arrayed on the first surface across from a bottom semiconductive device.

20. The stacked multi-chip package of claim 17, further including a radio-frequency, device on the stacked semiconductor package substrate on the radio side.

21. A process of assembling a stacked multiple-chip package, comprising:
assembling a semiconductive device to a vertical-device stiffener on a first side of the vertical device stiffener, to couple the semiconductive device to an insulated trace on the first side of the vertical device stiffener,
assembling the vertical-device stiffener orthogonally to a first surface of a land-side semiconductor package substrate, wherein the first surface carries a bottom semiconductive device; and
assembling a stacked semiconductor package substrate orthogonally at a semiconductor device side to the vertical-device stiffener, wherein the semiconductor device side carries a hanging semiconductive device.

22. The process of claim 21, wherein the vertical-device stiffener includes a second side, further including assembling a radio-frequency device to the vertical-device stiffener on the second side, to couple to an embedded trace on the second side.

23. The process of claim 21, wherein the vertical-device stiffener is a first vertical-device stiffener, further including:
assembling a subsequent semiconductive device to a subsequent vertical-device stiffener on a first side of the subsequent vertical device stiffener, to couple the subsequent semiconductive device to an insulated trace on the first side of the subsequent vertical device stiffener; and
assembling the subsequent vertical-device stiffener orthogonally to the first surface of the land-side semiconductor package substrate, wherein the first and subsequent vertical-device stiffeners are spaced apart by the bottom semiconductive device.

24. The process of claim 23, wherein the subsequent vertical-device stiffener includes a second side, further including assembling a subsequent radio-frequency device to the subsequent vertical-device stiffener on the second side, to couple to an embedded trace on the second side.

* * * * *